(12) United States Patent
Choi et al.

(10) Patent No.: US 11,758,754 B2
(45) Date of Patent: Sep. 12, 2023

(54) DISPLAY APPARATUS

(71) Applicant: LG Display Co., Ltd., Seoul (KR)

(72) Inventors: Taejin Choi, Paju-si (KR); JooHwan Shin, Paju-si (KR); MinHo Oh, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 171 days.

(21) Appl. No.: 17/131,638

(22) Filed: Dec. 22, 2020

(65) Prior Publication Data

US 2021/0193963 A1 Jun. 24, 2021

(30) Foreign Application Priority Data

Dec. 24, 2019 (KR) .................. 10-2019-0174276

(51) Int. Cl.
*H10K 50/844* (2023.01)
*H10K 50/84* (2023.01)
*H10K 59/131* (2023.01)

(52) U.S. Cl.
CPC ......... *H10K 50/844* (2023.02); *H10K 50/846* (2023.02); *H10K 59/131* (2023.02)

(58) Field of Classification Search
CPC ............. H01L 51/5253; H01L 51/5259; H01L 27/3276; H10K 50/844; H10K 50/846; H10K 59/131
See application file for complete search history.

(56) References Cited

U.S. PATENT DOCUMENTS

| 9,736,950 | B2 | 8/2017 | Kwon et al. | |
| 10,674,632 | B2 | 6/2020 | Park et al. | |
| 2012/0250290 | A1* | 10/2012 | Park | G02F 1/133615 |
| | | | | 362/382 |
| 2015/0187845 | A1* | 7/2015 | Kim | H10K 59/40 |
| | | | | 257/40 |
| 2017/0034928 | A1 | 2/2017 | Kwon et al. | |
| 2018/0146572 | A1* | 5/2018 | Park | G02F 1/133382 |
| 2018/0157091 | A1* | 6/2018 | Lee | G02F 1/13452 |
| 2018/0157094 | A1* | 6/2018 | Lee | G02F 1/133382 |
| 2019/0011760 | A1* | 1/2019 | Wang | H05K 7/20454 |
| 2019/0235691 | A1* | 8/2019 | Kim | G06F 3/0416 |
| 2020/0260612 | A1 | 8/2020 | Park et al. | |

FOREIGN PATENT DOCUMENTS

| KR | 10-2015-0055213 A | 5/2015 |
| KR | 10-2017-0015597 A | 2/2017 |
| KR | 10-2017-0018670 A | 2/2017 |
| KR | 10-2018-0058893 A | 6/2018 |

* cited by examiner

*Primary Examiner* — Vongsavanh Sengdara
(74) *Attorney, Agent, or Firm* — Fenwick & West LLP

(57) ABSTRACT

A display apparatus having enhanced heat dissipation performance is provided. The display apparatus includes a substrate including a display area with a light emitting device disposed therein and a non-display area surrounding the display area, an adhesive layer covering the light emitting device, a heat dissipation substrate provided on the adhesive layer, a pad part provided in the non-display area of the substrate, a circuit film electrically connected to the pad part, and a printed circuit board disposed on the heat dissipation substrate and electrically connected to the circuit film, wherein the heat dissipation substrate is disposed in the outermost portion of the display apparatus.

21 Claims, 4 Drawing Sheets

FIG. 5

| Encap. Thickness | 0.08mm | | 0.2mm | | 0.5mm | | 2.0mm | |
|---|---|---|---|---|---|---|---|---|
| | front temperature (°C) | rear temperature (°C) | front temperature (°C) | rear temperature (°C) | front temperature (°C) | rear temperature (°C) | front temperature (°C) | rear temperature (°C) |
| Invar (Ref.) | 101.7 | 102.9 | 98.3 | 99.4 | 89.8 | 90.6 | 68.4 | 68.6 |
| SUS | 93.4 | 94.3 | 90.5 | 91.4 | 83.4 | 84.0 | 64.6 | 64.8 |
| AL | 79.2 | 79.8 | 64.9 | 65.0 | 52.1 | 51.9 | 44.2 | 43.8 |

DISPLAY APPARATUS

CROSS-REFERENCE TO RELATED APPLICATIONS

This application claims the benefit of the Korean Patent Application No. 10-2019-0174276 filed on Dec. 24, 2019, which is hereby incorporated by reference as if fully set forth herein.

BACKGROUND

Field of the Invention

The present disclosure relates to a display apparatus.

Discussion of the Related Art

With the advancement of information-oriented society, various requirements for display apparatuses for displaying an image are increasing. Therefore, various display apparatuses such as liquid crystal display (LCD) apparatuses, plasma display panels (PDPs), and organic light emitting display apparatuses are being used recently.

Organic light emitting display apparatuses among display apparatuses are self-emitting display apparatuses and do not need a separate backlight. Therefore, in comparison with LCD apparatuses, the organic light emitting display apparatuses may be implemented to be lightweight and thin and to have low power consumption. Also, the organic light emitting display apparatuses are driven with a direct current (DC) low voltage, have a fast response time, and have low manufacturing cost.

Heat occurs when an organic light emitting display apparatus is being driven, and causes a reduction in performance of the organic light emitting display apparatus. Therefore, an inner plate, a back cover and other components are additionally required and separately coupled for heat dissipation and rigidity of an organic light emitting device. However, an organic light emitting display apparatus in the related art may give negative effect to its weight, thickness, and structures; and consumers are keep demanding a display apparatus having an optimized balance in its structure and performance (such as in light weight, thickness, durability, heat dissipation, driving performances and etc.).

SUMMARY

Accordingly, the present disclosure is directed to providing a display apparatus that substantially obviates one or more problems due to limitations and disadvantages of the related art.

An aspect of the present disclosure is directed to providing a display apparatus having enhanced heat dissipation performance and having an optimized balance in its slim and light structure.

Additional advantages and features of the disclosure will be set forth in part in the description which follows and in part will become apparent to those having ordinary skill in the art upon examination of the following or may be learned from practice of the disclosure. The objectives and other advantages of the disclosure may be realized and attained by the structure particularly pointed out in the written description and claims hereof as well as the appended drawings.

To achieve these and other advantages and in accordance with the purpose of the disclosure, as embodied and broadly described herein, there is provided a display apparatus including a substrate comprising a display area with a light emitting device disposed therein and a non-display area surrounding the display area, an adhesive layer covering the light emitting device, a heat dissipation substrate provided on the adhesive layer, a pad part provided in the non-display area of the substrate, a circuit film electrically connected to the pad part, and a printed circuit board disposed on the heat dissipation substrate and electrically connected to the circuit film, wherein the heat dissipation substrate is disposed in the outermost portion of the display apparatus.

It is to be understood that both the foregoing general description and the following detailed description of the present disclosure are exemplary and explanatory and are intended to provide further explanation of the disclosure as claimed.

BRIEF DESCRIPTION OF THE DRAWINGS

The accompanying drawings, which are included to provide a further understanding of the disclosure and are incorporated in and constitute a part of this application, illustrate embodiments of the disclosure and together with the description serve to explain the principle of the disclosure. In the drawings:

FIG. 5 is a table showing heat dissipation performance of a display apparatus with respect to the thickness and the material of metal.

DETAILED DESCRIPTION OF THE DISCLOSURE

Figure 1:
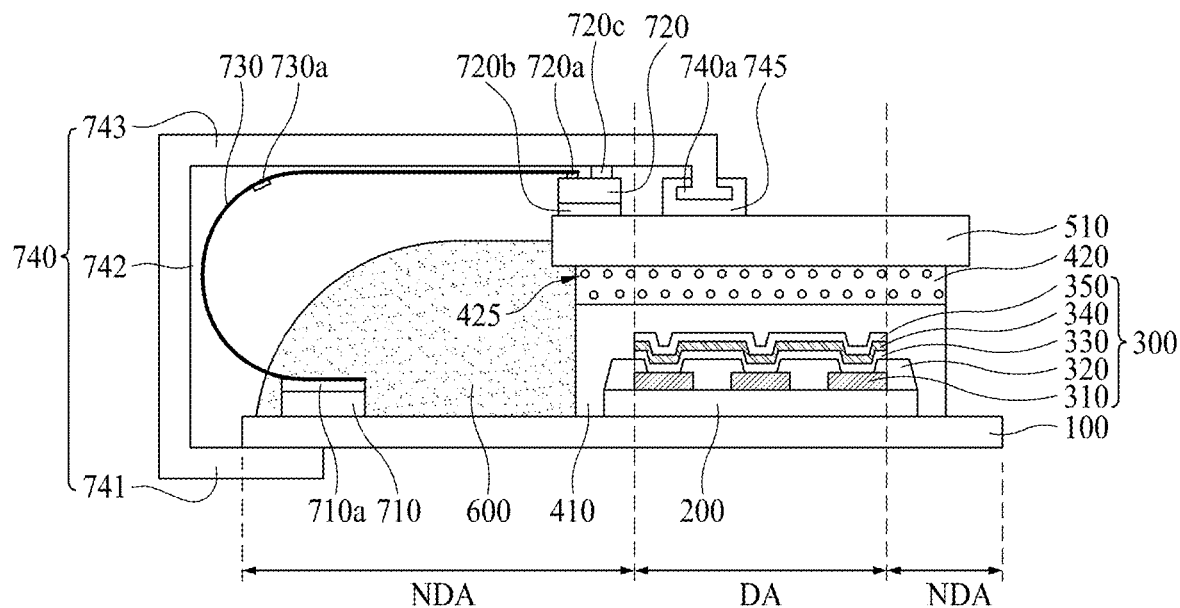
FIG. 1 is a cross-sectional view illustrating a display apparatus according to a first embodiment of the present disclosure.

Reference will now be made in detail to the exemplary embodiments of the present disclosure, examples of which are illustrated in the accompanying drawings. Wherever possible, the same reference numbers will be used throughout the drawings to refer to the same or like parts.

Advantages and features of the present disclosure, and implementation methods thereof will be clarified through following embodiments described with reference to the accompanying drawings. The present disclosure may, however, be embodied in different forms and should not be construed as limited to the embodiments set forth herein. Rather, these embodiments are provided so that this disclosure will be thorough and complete, and will fully convey the scope of the present disclosure to those skilled in the art. Further, the present disclosure is only defined by scopes of claims.

A shape, a size, a ratio, an angle, and a number disclosed in the drawings for describing embodiments of the present disclosure are merely an example, and thus, the present disclosure is not limited to the illustrated details. Like reference numerals refer to like elements throughout. In the following description, when the detailed description of the relevant known function or configuration is determined to unnecessarily obscure the important point of the present disclosure, the detailed description will be omitted. In a case where 'comprise', 'have', and 'include' described in the present specification are used, another part may be added unless 'only~' is used. The terms of a singular form may include plural forms unless referred to the contrary.

In construing an element, the element is construed as including an error range although there is no explicit description.

In describing a position relationship, for example, when a position relation between two parts is described as 'on~', 'over~', 'under~', and 'next~', one or more other parts may be disposed between the two parts unless 'just' or 'direct' is used.

In describing a time relationship, for example, when the temporal order is described as 'after~', 'subsequent~', 'next~', and 'before~', a case which is not continuous may be included unless 'just' or 'direct' is used.

It will be understood that, although the terms "first", "second", etc. may be used herein to describe various elements, these elements should not be limited by these terms. These terms are only used to distinguish one element from another. For example, a first element could be termed a second element, and, similarly, a second element could be termed a first element, without departing from the scope of the present disclosure.

A first horizontal axis direction, a second horizontal axis direction, and a vertical axis direction should not be construed as only a geometric relationship where a relationship therebetween is vertical, and may denote having a broader directionality within a scope where elements of the present disclosure operate functionally.

An X axis direction, a Y axis direction, and a Z axis direction should not be construed as only a geometric relationship where a relationship therebetween is vertical, and may denote having a broader directionality within a scope where elements of the present disclosure operate functionally.

In describing the elements of the present disclosure, terms such as first, second, A, B, (a), (b), etc., may be used. Such terms are used for merely discriminating the corresponding elements from other elements and the corresponding elements are not limited in their essence, sequence, or precedence by the terms. It will be understood that when an element or layer is referred to as being "on" or "connected to" another element or layer, it can be directly on or directly connected to the other element or layer, or intervening elements or layers may be present. Also, it should be understood that when one element is disposed on or under another element, this may denote a case where the elements are disposed to directly contact each other, but may denote that the elements are disposed without directly contacting each other.

The term "at least one" should be understood as including any and all combinations of one or more of the associated listed elements. For example, the meaning of "at least one of a first element, a second element, and a third element" denotes the combination of all elements proposed from two or more of the first element, the second element, and the third element as well as the first element, the second element, or the third element.

Features of various embodiments of the present disclosure may be partially or overall coupled to or combined with each other, and may be variously inter-operated with each other and driven technically as those skilled in the art can sufficiently understand. The embodiments of the present disclosure may be carried out independently from each other, or may be carried out together in co-dependent relationship.

Hereinafter, embodiments of the present disclosure will be described in detail with reference to the accompanying drawings.

Figure 2:
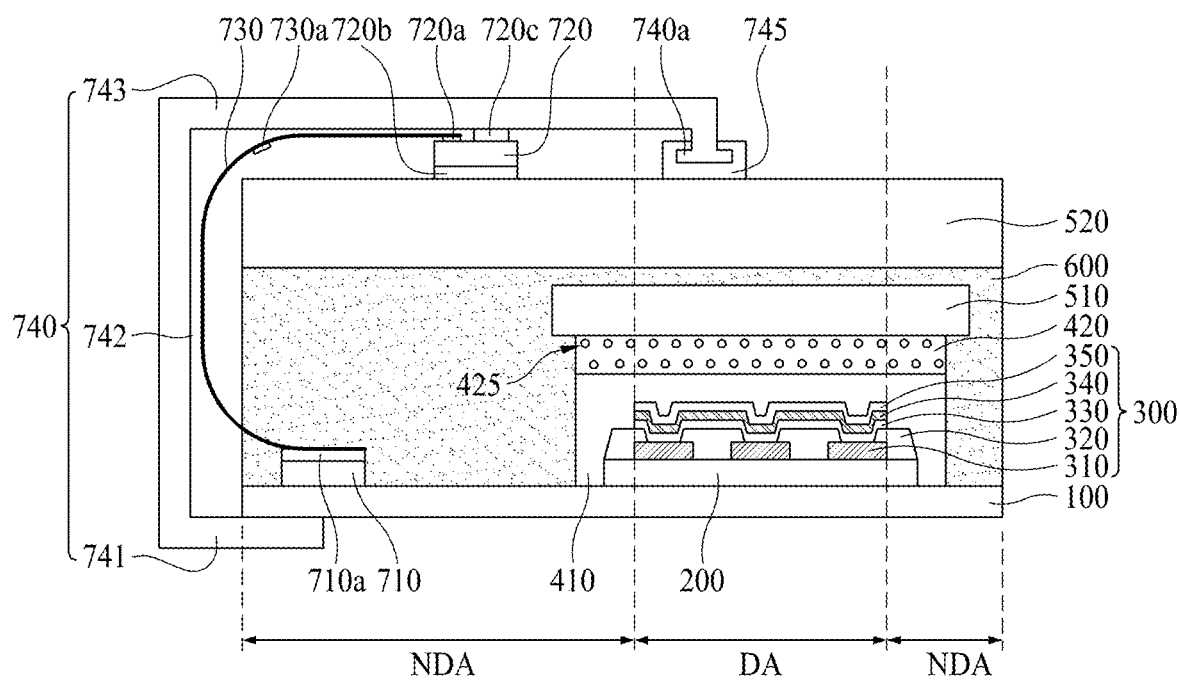
FIG. 2 is a cross-sectional view illustrating a display apparatus according to a second embodiment of the present disclosure.

FIG. 1 is a cross-sectional view illustrating a display apparatus according to a first embodiment of the present disclosure. FIG. 2 is a cross-sectional view illustrating a display apparatus according to a second embodiment of the present disclosure. Hereinafter, an example where the display apparatus according to the first and second embodiments of the present disclosure is an organic light emitting display apparatus will be mainly described, but the present disclosure is not limited thereto.

Referring to FIGS. 1 and 2, the display apparatus according to the first and second embodiments of the present disclosure may include a substrate 100, a circuit device layer 200, a light emitting device 300, a first adhesive layer 410, a second adhesive layer 420, a first metal layer 510, and a first circuit cover 740.

The substrate 100 may be divided into a display area DA and a non-display area NDA. The display area DA may be an area which emits light by using the light emitting device 300, and the non-display area NDA may be formed to surround the display area DA.

The substrate 100 may be a plastic film, a glass substrate, or a silicon wafer substrate formed through a semiconductor process.

The display apparatus according to the first and second embodiments of the present disclosure may be implemented as a bottom emission type where emitted light travels toward the substrate. In this case, the substrate 100 may include a transparent material. For example, the substrate 100 may include a top surface and a bottom surface (or a light output surface) opposite to the top surface.

The circuit device layer 200 may be formed on the top surface of the substrate 100. A circuit device including various signal lines, a thin film transistor (TFT), and a capacitor may be included in the circuit device layer 200. The signal lines may include a gate line, a data line, a power line, and a reference line, and the TFT may include a switching TFT, a driving TFT, and a sensing TFT.

The switching TFT may be turned on based on a gate signal supplied through the gate line and may transfer a data voltage, supplied through the data line, to the driving TFT.

The driving TFT may be turned on based on the data voltage supplied through the switching TFT and may generate a data current from power supplied through the power line to supply the data current to the light emitting device.

The sensing TFT may sense a threshold voltage deviation of the driving TFT causing the degradation in image quality and may transfer a current of the driving TFT to the reference line in response to a sensing control signal supplied through the gate line of the sensing TFT or a separate sensing line.

The capacitor may hold the data voltage supplied through the driving TFT during one frame and may be connected to each of a gate terminal and a source terminal of the driving TFT.

A contact hole may be provided in the circuit device layer 200, and thus, the source terminal or a drain terminal of the driving TFT may be exposed through the contact hole.

The light emitting device 300 may be formed on the circuit device layer 200. The light emitting device 300 may include a first electrode 310, a bank 320, a light emitting layer 330, a second electrode 340, and a capping layer 350.

The first electrode 310 may be formed on the circuit device layer 200. The first electrode 310 may be connected to the source terminal or the drain terminal of the driving TFT through the contact hole. The first electrode 310 may include a transparent material, or may include an opaque material.

In a case where the display apparatus according to the first and second embodiments of the present disclosure is implemented as the bottom emission type, the first electrode 310 may include a transparent conductive material (TCO), such as indium tin oxide (ITO) or indium zinc oxide (IZO), or a semi-transmissive conductive material such as magnesium (Mg), silver (Ag), or an alloy of Mg and Ag.

The bank 320 may be formed on the first electrode 310 and may define an emission area. An electric field may not be formed between the first electrode 310 and the second electrode 340, in a region where the bank 320 is formed, and thus, light may not be emitted.

The bank 320 may be implemented as an organic layer such as acryl resin, epoxy resin, phenolic resin, polyamide resin, or polyimide resin. Alternatively, the bank 320 may be implemented as an inorganic layer such as silicon nitride, aluminum nitride, zirconium nitride, titanium nitride, hafnium nitride, tantalum nitride, silicon oxide, aluminum oxide, or titanium oxide.

The light emitting layer 330 may be formed on the first electrode 310. The light emitting layer 330 may be formed on the bank 340.

The light emitting layer 330 may include a hole transporting layer, an organic light emitting layer, and an electron transporting layer. In this case, when a voltage is applied to the first electrode 310 and the second electrode 340, a hole and an electron may move to the light emitting layer 330 through the hole transporting layer and the electron transporting layer, respectively, and may be combined in the light emitting layer 330 to emit light.

The light emitting layer 330 may include a white light emitting layer emitting white light. Alternatively, the light emitting layer 330 may include at least one of a red light emitting layer emitting red light, a green light emitting layer emitting green light, and a blue light emitting layer emitting blue light.

The second electrode 340 may be formed on the light emitting layer 330. The second electrode 340 may include a transparent material, or may include an opaque material.

In a case where the display apparatus according to the first and second embodiments of the present disclosure is implemented as the bottom emission type, the second electrode 340 may include a metal material, which is high in reflectance, such as a stacked structure (titanium/aluminum/titanium (Ti/Al/fi)) of Al and Ti, a stacked structure (ITO/Al/ITO) of Al and ITO, an APC alloy, and a stacked structure (ITO/APC/ITO) of an APC alloy and ITO. In this case, the APC alloy may be an alloy of silver (Ag), palladium (Pb), and copper (Cu).

The capping layer 350 may be formed on the second electrode 340 and may protect the second electrode 340. The capping layer 350 may be implemented as a multilayer where one or more inorganic layers of silicon oxide (SiOx), silicon nitride (SiNx), and/or silicon oxynitride (SiON) are alternately stacked.

The first adhesive layer 410 may be provided on the capping layer 350 and the light emitting device 300 and may be formed to cover the capping layer 350 and the light emitting device 300.

The first adhesive layer 410 may be formed to have a sufficient thickness, for preventing particles from penetrating into the light emitting device 300.

The first adhesive layer 410 may include an organic material.

The first adhesive layer 410 may include acryl resin, epoxy resin, phenolic resin, polyamide resin, polyimide resin, or olefin.

The first adhesive layer 410 may be formed by a vapor deposition process, a printing process, or a slit coating process, which uses an organic material, but is not limited thereto and the first adhesive layer 410 may be formed by an ink-jet process.

The second adhesive layer 420 may be provided on the first adhesive layer 410.

The second adhesive layer 420 may include an organic material.

The second adhesive layer 420 may include acryl resin, epoxy resin, phenolic resin, polyamide resin, polyimide resin, or olefin.

The second adhesive layer 420 may be formed by a vapor deposition process, a printing process, or a slit coating process, which uses an organic material, but is not limited thereto and the second adhesive layer 420 may be formed by an ink-jet process.

The second adhesive layer 420 may include a getter 425 which absorbs water and hydrogen. The getter 425 may be one of alkali metal, alkali earth metal, an inert compound of alkali metals, and an inert compound of alkali earth metals. Accordingly, water and hydrogen flowing in from the outside may be absorbed by the getter 425 in the second adhesive layer 420, and thus, the light emitting device 300 may be prevented from being damaged by water and hydrogen.

The first metal layer 510 may be provided on the second adhesive layer 420. The first metal layer 510 is directly attached to the substrate by the first and second adhesive layer, each having parallel surfaces.

The first metal layer 510 may protect the light emitting device 300 from the outside and may discharge heat, occurring in the light emitting device 300, to the outside, thereby enhancing the performance of the light emitting device 300. Accordingly, the first metal layer 510 may be referred to as a heat dissipation layer or a heat dissipation substrate.

A bottom surface of the first metal layer 510 may be formed to be bigger than or equal to a top surface of the second adhesive layer 420. Also, the top surface of the second adhesive layer 420 may not be externally exposed by the bottom surface of the first metal layer 510. Accordingly, an area, exposed to the outside, of the getter 425 of the second adhesive layer 420 may be minimized, thereby decreasing a speed at which the getter 425 is oxidized.

The first metal layer 510 may include Al, but is not limited thereto. For example, the first metal layer 510 may include one or more materials of stainless steel, Al, a magnesium (Mg) alloy, a magnesium-lithium (Mg—Li) alloy, and an Al alloy, but is not limited thereto.

The display apparatus according to the first and second embodiments of the present disclosure may further include a resin layer 600, a second metal layer 520, and a pad part 710.

Referring to FIG. 1, a resin layer 600 according to the first embodiment may be provided in the non-display area NDA of the substrate 100. For example, the resin layer 600 may additionally cover a portion of one side surface of the first metal layer 510 adjacent to the pad part 710. For example, the resin layer 600 may additionally cover the first adhesive layer 410 which passes over one side surface of the first metal layer 510 and protrudes or overflows toward the pad part 710. In this case, a thickness of the first metal layer 510 may be larger than or equal to 3.0 mm—for securing the heat dissipation performance of the display apparatus.

Referring to FIG. 2, a resin layer 600 according to the second embodiment may be provided in the display area DA and the non-display area NDA.

The resin layer 600 may be formed to cover the circuit device layer 200, the light emitting device 300, the first adhesive layer 410, the second adhesive layer 420, and the first metal layer 510. Therefore, the resin layer 600 may transfer, to the second metal layer 520, heat occurring in the light emitting device 300 and heat discharged from the first metal layer 510, thereby enhancing the heat dissipation performance of the display apparatus. For better heat dissipation performance and slim and light structure, the second metal layer is directly attached to the first metal layer by the resin layer, each having parallel surfaces, and the resin layer may be provided on the first metal layer 510 in the display area DA and only in a portion of the non-display area NDA, not exceeding an area of a top surface of the first metal layer 510.

In order to secure heat transfer performance, a thickness of the resin layer 600 between the first metal layer 510 and the second metal layer 520 may be larger than or equal to 0.1 mm or about 0.3 mm, but is not limited thereto. For example, the resin layer 600 may be thinner than the first metal layer 510 in the display area DA and may be thicker than the first metal layer 510 in the non-display area NDA.

According to the second embodiment, when a thickness of the first metal layer 510 is in the range of 0.1 mm to 0.3 mm, a thickness of the resin layer 600 between the first metal layer 510 and the second metal layer 520 may be larger than or equal to 0.3 mm. In this case, the resin layer 600 may be thicker than a thickness of the first metal layer 510 in the display area DA and in the non-display area NDA.

The second metal layer 520 may be provided on the resin layer 600. The first metal layer 510, the resin layer 600, and the second metal layer 520 as a whole may function or referred to as a heat dissipation substrate.

Heat transferred to the resin layer 600 may be discharged to the outside of the display apparatus by the second metal layer 520, thereby enhancing the performance of the display apparatus. Additionally, the resin layer 600 may include a heat transferring material or a thermal conductive particle for transferring heat of the first metal layer 510 to the second metal layer 520. The second metal layer 520 and the resin layer 600 may be formed to have the same area as that of the substrate 100, but it is not limited thereto. The top surface of the substrate 100 may not be exposed to the outside. Accordingly, a thickness of an edge of the display apparatus may increase, and thus, the damage to the display apparatus caused by external pressure may be minimized.

The second metal layer 520 may be formed to include Al, but is not limited thereto.

A thickness of the second metal layer 520 may be thicker than that of the first metal layer 510 for better heat dissipation and rigidity of the display apparatus, and thus, the second metal layer may be referred to as a protection substrate. When the second metal layer 520 is formed to include Al, a thickness of the second metal layer 520 may be in the range of 2.0 mm to 2.5 mm for securing the heat dissipation performance of the second metal layer 520, but is not limited thereto.

The pad part 710 may be provided in the non-display area NDA and may be provided at one edge of the substrate 100.

The pad part 710 may be covered by the resin layer 600. Therefore, the pad part 710 may not be exposed to the outside, thereby preventing a stripping defect and blocking an impact applied from the outside. Also, heat occurring in the pad part 710 may be transferred to the second metal layer 520 by the resin layer 600, and thus, may be discharged to the outside of the display apparatus.

A plurality of electrodes connected to the circuit device layer 200 may be formed in the pad part 710.

A conductive film 710a may be formed on a top surface of the pad part 710. Accordingly, the pad part 710 may be electrically connected to a circuit film 730 through the conductive film 710a. For example, the conductive film 710a may be an anisotropic conductive film.

The display apparatus according to the first and second embodiments of the present disclosure may further include a printed circuit board (PCB) 720, a circuit film 730, and a first circuit cover 740.

Referring to FIG. 1, in the first embodiment, the PCB 720 may be provided on the first metal layer 510 and may provide various signals for driving the display apparatus.

The conductive film 720a may be formed on a top surface of the PCB 720. Therefore, the PCB 720 may be electrically connected to the circuit film 730 through the conductive film 720a. In this case, a thickness of the first metal layer 510 may be larger than or equal to 3.0 mm, and the pad part 710 may be formed to be covered by the first adhesive layer 410 or the second adhesive layer 420, or may be formed on the substrate 100 uncovered by the first adhesive layer 410.

A first adhesive member 720b may be provided on a bottom surface of the PCB 720. Therefore, the PCB 720 may be attached to the first metal layer 510. For example, the first adhesive member 720b may be disposed between the PCB 720 and the first metal layer 510. Accordingly, the PCB 720 may be attached on the first metal layer 510 by the first adhesive member 720b.

A second adhesive member 720c may be provided in an area, where the conductive film 720a is not provided, of the top surface of the PCB 720. Therefore, the first circuit cover 740 may be attached to the PCB 720. For example, the second adhesive member 720c may be disposed between the PCB 720 and the first circuit cover 740. Accordingly, the first circuit cover 740 may be attached to the PCB 720 by the second adhesive member 720c.

One side of the circuit film 730 may be electrically connected to the conductive film 710a of the pad part 710, and the another side thereof may be electrically connected to the conductive film 720a of the PCB 720. That is, the pad part 710 may be electrically connected to the PCB 720 by the circuit film 730.

In detail, the circuit film 730 may be provided on a top surface of the conductive film 710a of the pad part 710 and may be implemented to pass through the resin layer 600 of the non-display area NDA and to extend firstly toward the outside of the display apparatus. Also, the circuit film 730 may be bent inwardly and extend along a side surface of the resin layer 600, a top surface of the resin layer 600, a side surface of the first metal layer 510, and a top surface of the first metal layer 510. In this case, the circuit film 730 may be apart from the first metal layer 510 not to contact the first metal layer 510. Also, an end of the circuit film 730 which is bent inwardly may be provided on a top surface of the conductive film 720a of the PCB 720. Therefore, according to the present disclosure, the damage to the circuit film 730 caused by an end of the first metal layer 510 and stress occurring on the surface of the circuit film 730 when the circuit film 730 is bent may be reduced compared to a structure of a related art circuit film where the circuit film formed on the top surface of the pad part is implemented to extend directly toward the inside of the display apparatus from the non-display area NDA to the display area DA without extending firstly toward the outside of the display apparatus. Also, the stability of the circuit film 730 may be secured, and thus, a thickness of the first metal layer 510 may increase, thereby enhancing the heat dissipation performance of the display apparatus. Furthermore, a thickness of the first metal layer 510 may increase so that a back cover or an inner plate fundamentally included in the display apparatus is replaced by or integrated into the first metal layer 510, thereby providing a display apparatus including no back cover or inner plate. Accordingly, the first metal layer 510 may be disposed at an outermost portion of the display apparatus, and the circuit film 730 may contact the PCB 720 provided on the first metal layer 510.

Referring to FIG. 2, in the second embodiment, the PCB 720 may be provided on the second metal layer 520 and may provide various signals for driving the display apparatus.

A first adhesive member 720b may be provided on the bottom surface of the PCB 720. Therefore, the PCB 720 may be attached to the second metal layer 520. For example, the first adhesive member 720b may be disposed between the PCB 720 and the second metal layer 520. Accordingly, the PCB 720 may be attached to the second metal layer 520 by the first adhesive member 720b.

One side of the circuit film 730 may be electrically connected to the conductive film 710a of the pad part 710, and the another side thereof may be electrically connected to the conductive film 720a of the PCB 720. That is, the pad part 710 may be electrically connected to the PCB 720 by the circuit film 730.

In detail, the circuit film 730 may be provided on a top surface of the conductive film 710a of the pad part 710 and may be implemented to pass through the resin layer 600 of the non-display area NDA and to extend firstly toward the outside of the display apparatus. Also, the circuit film 730 may be bent inwardly and extend along a side surface of the resin layer 600, a side surface of the second metal layer 520, and a top surface of the second metal layer 520. In this case, the circuit film 730 may be apart from the second metal layer 520 not to contact the second metal layer 520. Also, an end of the circuit film 730 which is bent inwardly may be provided on a top surface of the conductive film 720a of the PCB 720. Therefore, according to the present disclosure, the damage to the circuit film 730 caused by an end of the second metal layer 520 and stress occurring on the surface of the circuit film 730 when the circuit film 730 is bent may be reduced compared to the structure of the related art circuit film 730 where the circuit film 730 formed on the top surface of the pad part 710 is implemented to extend directly toward the inside of the display apparatus from the non-display area NDA to the display area DA without extending firstly toward the outside of the display apparatus. Also, the stability of the circuit film 730 may be secured, and thus, the thickness of the second metal layer 520 may increase, thereby enhancing the heat dissipation performance of the display apparatus. Furthermore, the thickness of the second metal layer 520 may increase so that a back cover or an inner plate fundamentally included in the display apparatus is replaced by or integrated into the second metal layer 520, thereby providing a display apparatus including no back cover or inner plate. Accordingly, the second metal layer 520 may be disposed at an outermost portion of the display apparatus, and the circuit film 730 may contact the PCB 720 provided on the second metal layer 520.

The circuit film 730 may be attached to the pad part 710 and the PCB 720 by a tape automated bonding (TAB) process. One side of the circuit film 730 connected to the pad part 710 may be covered by the resin layer 600. For example, the resin layer 600 may cover and surround the pad part 710 and the one side of the circuit film 730 connected to the pad part 710.

The circuit film 730 may include a tape carrier package (TCP) or a chip on film (or a chip on flexible board) (COF).

The circuit film 730 may include a driving integrated circuit (IC) 730a. The driving IC 730a may be a data driver IC or a driver IC for driving the display apparatus, but is not limited thereto.

The first circuit cover 740 may be attached to a bottom surface of the substrate 100 and may be implemented to extend along the circuit film 730. In this case, the first circuit cover 740 may be apart from the circuit film 730 not to contact the circuit film 730. Accordingly, the first circuit cover 740 may prevent an external impact from being applied to the circuit film 730.

The first circuit cover 740 may be implemented to cover a bottom edge (or a light output surface) of the substrate 100 overlapping the pad part 710. The first circuit cover 740 according to the second embodiment may include a front cover portion 741 which covers the bottom edge of the substrate 100 overlapping the pad part 710, a side cover portion 742 which extends (or is bent) to be vertical from the front cover portion 741 and covers a side surface of each of the substrate 100, the resin layer 600, and the second metal layer 520, and a rear cover portion 743 which extends (or is bent) to be vertical from the side cover portion 742 toward the second metal layer 520 and covers the circuit film 730 and the PCB 720. Similarly, the first circuit cover 740 according to the first embodiment may include the front cover portion 741 which covers the bottom edge of the substrate 100 overlapping the pad part 710, the side cover portion 742 which extends (or is bent) to be vertical from the front cover portion 741 and covers a side surface of each of the substrate 100, the resin layer 600, and the first metal layer 510, and a rear cover portion 743 which extends (or is bent) to be vertical from the side cover portion 742 toward the first metal layer 520 and covers the circuit film 730 and the PCB 720.

The first circuit cover 740 may be attached to the PCB 720 by the second adhesive member 720c. For example, the second adhesive member 720c may be disposed between the rear cover portion 743 of the first circuit cover 740 and the PCB 720.

According to the second embodiment, a coupling portion 740a may be provided at an end of the first circuit cover 740 overlapping the second metal layer 520, and a fixing pin 745 may be provided on a top surface of the second metal layer 520. The fixing pin 745 may be provided in a region, which does not overlap the PCB 720 and the circuit film 730, of the top surface of the second metal layer 520. The coupling portion 740a may have a shape where a side surface thereof protrudes, and a groove may be provided in an upper portion of the fixing pin 745. Therefore, the first circuit cover 740 may be fixed to the top surface of the second metal layer 520 by coupling of the fixing pin 745 and the coupling portion 740a of the first circuit cover 740. It should be noted that, the coupling portion 740a and the fixing pin 745 as described above may also be applied in the first embodiment and the redundant description is omitted.

Figure 3A:
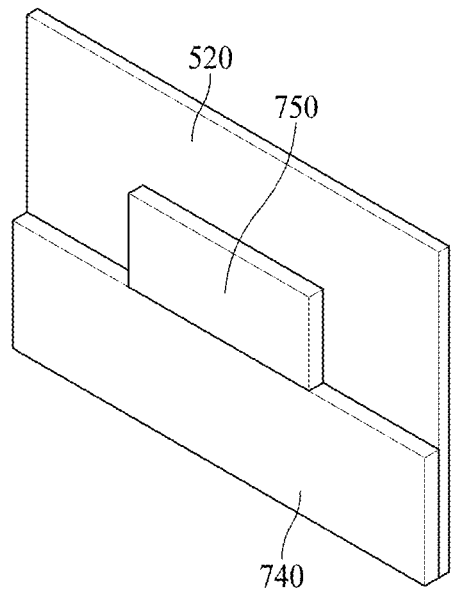
FIGS. 3A and 3B are rear and exploded perspective views illustrating the display apparatus according to the second embodiment of the present disclosure, respectively.
Figure 3B:
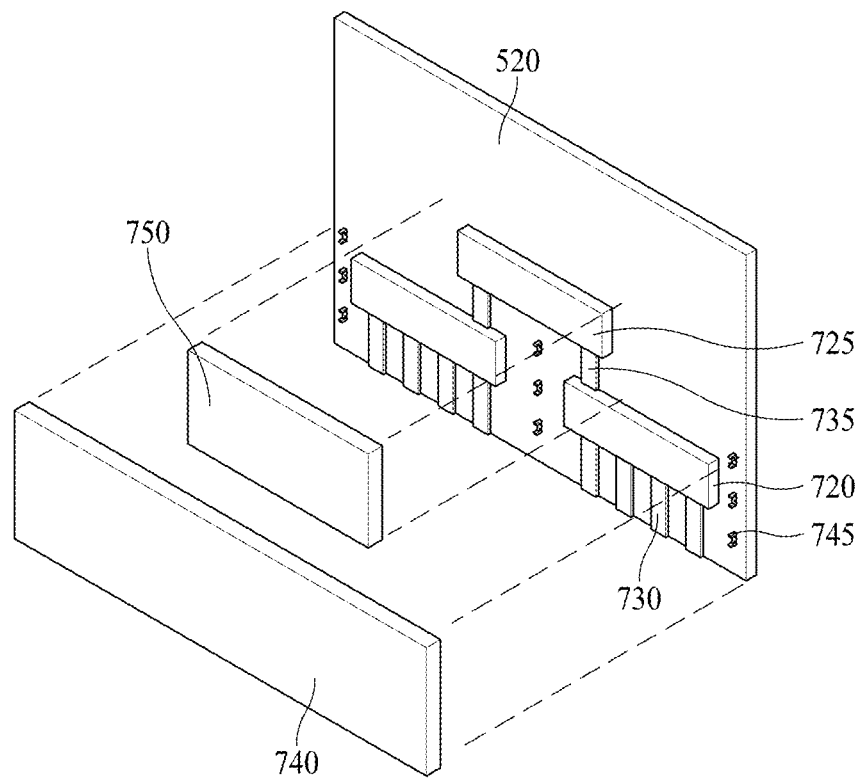

FIGS. 3A and 3B are rear and exploded perspective views illustrating the display apparatus according to the second embodiment of the present disclosure, respectively.

FIG. 3A is a rear perspective view illustrating the display apparatus according to the second embodiment of the present disclosure. As illustrated in FIG. 3A, a second metal layer 520 covers a rear surface of the display apparatus and may be disposed at an outermost portion of the display apparatus thereby replacing or integrating a back cover or an inner plate. The first circuit cover 740 may be provided on a top surface of the second metal layer 520 and a bottom surface of a substrate 100, and a second circuit cover 750 may be provided on the top surface of the second metal layer 520.

FIG. 3B is an exploded perspective view illustrating the display apparatus according to the second embodiment of the present disclosure and is a perspective view illustrating an example where the first circuit cover 740 and the second circuit cover 750 in FIG. 3A are separated from each other.

A plurality of PCBs 720, a control PCB 725, a plurality of circuit films 730, a plurality of control circuit films 735, and a plurality of fixing pins 745 may be provided on a top surface of the second metal layer 520.

The control PCB 725 may be electrically connected to the plurality of PCBs 720 through the plurality of control circuit films 735 (or a signal cable). One side of each of the plurality of control circuit films 735 may be connected to the control PCB 725, and the other sides of the plurality of control circuit films 735 may be respectively connected to the plurality of PCBs 720. Therefore, the control PCB 725 may supply the plurality of PCBs 720 with a signal for driving the display apparatus. For example, the control PCB 725 may be referred to as a control board.

The plurality of PCBs 720 may be electrically connected to the plurality of pad parts 710 through the plurality of circuit films 730. One side of each of the plurality of circuit films 730 may be connected to the PCB 720, and the other sides of the plurality of driving circuit films 730 may be respectively connected to the plurality of pad parts 710. Therefore, the PCB 720 may transfer a signal, supplied from the control PCB 725, to the plurality of pad parts 710. For example, each of the plurality of PCBs 720 may be referred to as a source PCB or a data PCB.

The first circuit cover 740 may be implemented to cover the plurality of circuit films 730 and the plurality of PCBs 720. For example, the first circuit cover 740 may cover the plurality of PCBs 720, the plurality of circuit films 730 connected to the plurality of PCBs 720, and the plurality of fixing pins 745.

The second circuit cover 750 may be implemented to cover the control PCB 725. For example, the second circuit cover 750 may cover the control PCB 725 and the plurality of control circuit films 735 connected to the control PCB 725.

The first circuit cover 740 may be attached to the bottom surface of the substrate 100 by adhesive material.

Alternatively, the first circuit cover 740 may be fixed to the top surface of the second metal layer 520 through coupling of the coupling portion 740*a* and the fixing pin 745. In detail, the plurality of fixing pins 745 may be provided in a region between two PCBs 720 adjacent to each other, a region between two circuit films 730 adjacent to each other, and a region apart from an end of the PCB 720, on a top surface of the second metal layer 520, but is not limited thereto. Also, when the first circuit cover 740 is provided on the plurality of PCBs 720 and the plurality of circuit films 730, the coupling portion 740*a* may be provided at a position, corresponding to the fixing pin 745, of the first circuit cover 740. Therefore, the first circuit cover 740 may be conveniently attached/detached on/from the top surface of the second metal layer 520 through coupling of the coupling portion 740*a* and the fixing pin 745.

Moreover, the second circuit cover 750 may be conveniently attached/detached on/from the top surface of the second metal layer 520 through coupling of a coupling portion (not shown) and a fixing pin (not shown) on the basis of the same coupling manner as the first circuit cover 740 and may also be attached on the top surface of the second metal layer 520 by using an adhesive material. It should be noted that the first circuit cover 740 and the second circuit cover 750 as described above may also be applied in the first embodiment and the redundant description is omitted FIG. 4 is a front perspective view illustrating the display apparatus according to the first and second embodiments of the present disclosure.

Figure 4:
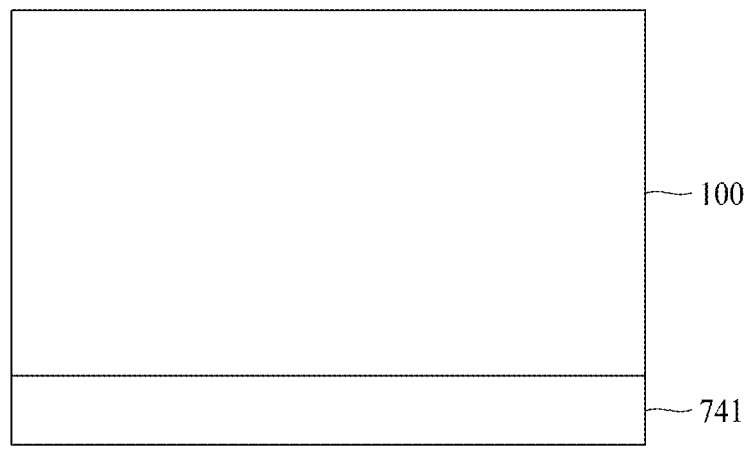
FIG. 4 is a front perspective view illustrating the display apparatus according to the first and second embodiments of the present disclosure.

The substrate 100 may include a top surface including the pad part 710 and a light output surface opposite the top surface, and in FIG. 4, the light output surface is illustrated. As described above, the first circuit cover 740 may include the front cover portion 741, the side cover portion 742, and the rear cover portion 743, and the front cover portion 741 may cover an edge of the light output surface of the substrate 100 overlapping the pad part 710.

FIG. 5 is a table showing heat dissipation performance of a display apparatus with respect to a thickness and a material of metal.

As shown in FIG. 5, each column of the table shows the heat dissipation performance of the display apparatus with respect to the kind of metal encapsulating the display apparatus. In a case where invar, stainless steel (SUS), and Al are used for heat dissipation of the display apparatus under a condition where thicknesses are the same, it may be seen that the front temperature and the rear temperature of the display apparatus are lowest when Al is used. That is, the heat dissipation performance of Al is highest, among invar, stainless steel (SUS), and Al.

Moreover, as shown in FIG. 5, each row of the table shows the heat dissipation performance of the display apparatus with respect to the thickness of metal encapsulating the display apparatus. In a case where a thickness is changed to 0.08 mm, 0.2 mm, 0.5 mm, and 2.0 mm and the same metal is used for dissipating heat of the display apparatus, it may be seen that the front temperature and the rear temperature of the display apparatus are lowered as the thickness increases. That is, as the thickness of metal increases, the heat dissipation performance of the display apparatus is enhanced.

Therefore, the first metal layer 510 and the second metal layer 520 according to the present disclosure may include Al which is best in heat dissipation performance. Also, the heat dissipation performance of Al is not enhanced when Al has a certain thickness or more. Accordingly, in order to secure the most effective heat dissipation performance, when the second metal layer 520 includes Al, the thickness of the second metal layer 520 may be in the range of 2.0 mm to 2.5 mm.

A display apparatus according to the present disclosure will be described below.

A display apparatus according to an embodiment of the present disclosure includes a substrate comprising a display area with a light emitting device disposed therein and a non-display area surrounding the display area, an adhesive layer covering the light emitting device, a heat dissipation substrate provided on the adhesive layer, a pad part provided in the non-display area of the substrate, a circuit film electrically connected to the pad part, and a printed circuit board disposed on the heat dissipation substrate and electrically connected to the circuit film, wherein the heat dissipation substrate is disposed in the outermost portion of the display apparatus.

According to some embodiments of the present disclosure, the display apparatus further comprises a resin layer provided in at least the non-display area of the substrate to cover the pad part and one end of the circuit film connected to the pad part.

According to some embodiments of the present disclosure, the resin layer additionally covers at least a portion of one side surface of the first metal layer adjacent to the pad part, and/or additionally covers the adhesive layer which passes over the one side surface of the first metal layer and protrudes toward the pad part.

According to some embodiments of the present disclosure, the circuit film extends toward the printed circuit board along a side surface of the resin layer, a side surface of the first metal layer, and a top surface of the first metal layer.

According to some embodiments of the present disclosure, the resin layer additionally covers the light emitting device, the adhesive layer and the first metal layer, and the display apparatus further comprises a second metal layer provided on the resin layer.

According to some embodiments of the present disclosure, the circuit film extends toward the printed circuit board along a side surface of the resin layer, a side surface of the second metal layer, and a top surface of the second metal layer.

According to some embodiments of the present disclosure, the adhesive layer includes a first adhesive layer covering the light emitting device and a second adhesive layer provided on the first adhesive layer.

According to some embodiments of the present disclosure, the second adhesive layer includes a getter absorbing water and hydrogen.

According to some embodiments of the present disclosure, a bottom surface of the first metal layer is formed to be wider than a top surface of the second adhesive layer.

According to some embodiments of the present disclosure, the first metal layer and the second metal layer include aluminum (Al).

According to some embodiments of the present disclosure, a thickness of the second metal layer is set to be in the range of 2.0 mm to 2.5 mm.

According to some embodiments of the present disclosure, the second metal layer is thicker than the first metal layer.

According to some embodiments of the present disclosure, the second metal layer is formed on the resin layer to overlap the pad part.

According to some embodiments of the present disclosure, the display apparatus further includes a first adhesive member disposed between the printed circuit board and the second metal layer.

According to some embodiments of the present disclosure, the display apparatus further includes a first circuit cover covering the circuit film and the printed circuit board.

According to some embodiments of the present disclosure, the display apparatus further includes a second adhesive member disposed between the printed circuit board and the first circuit cover.

According to some embodiments of the present disclosure, one side of the first circuit cover is attached to a bottom surface of the substrate, and the another side of the first circuit cover is attached to a top surface of the second metal layer.

According to some embodiments of the present disclosure, the display apparatus further includes a coupling portion provided at an end of the first circuit cover and a fixing pin provided in a top surface of the second metal layer, wherein the first circuit cover is fixed to the top surface of the second metal layer by coupling of the coupling portion and the fixing pin.

According to some embodiments of the present disclosure, the coupling portion has a shape where a side surface thereof protrudes, and a groove is provided in an upper portion of the fixing pin.

According to some embodiments of the present disclosure, the display apparatus further includes a control printed circuit board provided on a top surface of the second metal layer, a plurality of control circuit films electrically connecting the control printed circuit board to the printed circuit board, and a second circuit cover covering the control printed circuit board and the plurality of control circuit films.

According to some embodiments of the present disclosure, a thickness of the first metal layer is set to be larger than or equal to 3.0 mm.

According to some embodiments of the present disclosure, the display apparatus further includes a circuit cover covering the pad part, the circuit film, and the printed circuit board, a first adhesive member disposed between the printed circuit board and the first metal layer, and a second adhesive member disposed between the printed circuit board and the first circuit cover.

According to some embodiments of the present disclosure, the display apparatus further includes a circuit cover covering the pad part, the circuit film, and the printed circuit board, wherein the substrate includes a top surface, including the pad part, and a light output surface opposite the top surface, and the circuit cover covers an edge of the light output surface of the substrate overlapping the pad part.

According to the present disclosure, a circuit film may be formed to contact the pad part and to extend toward the outside of the display apparatus along a side surface of the resin layer, a side surface of the first or second metal layer, and a top surface of the first or second metal layer, and thus, when the circuit film is bent inwardly, stress occurring in a surface of the circuit film and the damage to the circuit film caused by an end of the first or second metal layer may be reduced. Also, the stability of the circuit film may be secured, and thus, a thickness of the first metal layer or the second metal layer may increase, thereby enhancing the heat dissipation performance of the display apparatus. Furthermore, as a thickness of the first metal layer or the second metal layer increases, a back cover or an inner plate fundamentally included in the display apparatus may be replaced by or integrated into the first metal layer or the second metal layer, thereby providing a display apparatus including no back cover or inner plate.

Moreover, according to the present disclosure, a resin layer may be formed to cover a light emitting device and a first adhesive layer and may transfer, to a second metal layer, heat occurring in a light emitting device and heat discharged from a first metal layer, thereby enhancing the heat dissipation performance of a display apparatus.

Moreover, according to the present disclosure, the resin layer may be formed to cover a pad part, and thus, the pad part may not be exposed at the outside, thereby preventing a stripping defect and blocking an impact applied from the outside. Also, heat occurring in the pad part may be transferred to the second metal layer by the resin layer, and thus, heat occurring in the pad part may be discharged to the outside of the display apparatus.

The above-described feature, structure, and effect of the present disclosure are included in at least one embodiment of the present disclosure, but are not limited to only one embodiment. Furthermore, the feature, structure, and effect described in at least one embodiment of the present disclosure may be implemented through combination or modification of other embodiments by those skilled in the art. Therefore, content associated with the combination and modification should be construed as being within the scope of the present disclosure.

It will be apparent to those skilled in the art that various modifications and variations can be made in the present disclosure without departing from the spirit or scope of the disclosures. Thus, it is intended that the present disclosure covers the modifications and variations of this disclosure provided they come within the scope of the appended claims and their equivalents.

What is claimed is:

1. A display apparatus comprising:
a substrate comprising a display area and a non-display area surrounding the display area;
a light emitting device in the display area, the light emitting device configured to emit light in the display area;
an adhesive layer covering the light emitting device, at least a portion of the adhesive layer in the display area;
a heat dissipation substrate provided on the adhesive layer, at least a portion of the heat dissipation substrate in the display area;
a pad part provided in the non-display area of the substrate;
a circuit film electrically connected to the pad part; and
a printed circuit board disposed on the heat dissipation substrate and electrically connected to the circuit film;
wherein the heat dissipation substrate is disposed in an outermost portion of the display apparatus.

2. The display apparatus of claim 1, wherein the circuit film is implemented to extend firstly toward an outside of the display apparatus and then be bent inwardly so as to extend from the pad part to the printed circuit board.

3. The display apparatus of claim 1, further comprising a resin layer provided in at least the non-display area of the substrate to cover the pad part and one end of the circuit film connected to the pad part, and to cover at least a portion of one side surface of the heat dissipation substrate adjacent to the pad part.

4. The display apparatus of claim 3, wherein the circuit film extends toward the printed circuit board along a side surface of the resin layer, a side surface of the heat dissipation substrate, and a top surface of the heat dissipation substrate.

5. The display apparatus of claim 1, wherein the heat dissipation substrate further comprises a first metal layer on the adhesive layer and a second metal layer on the first metal layer.

6. The display apparatus of claim 5, further comprising a resin layer provided in the display area and the non-display area of the substrate, wherein the resin layer overlaps with the light emitting device, the adhesive layer and the first metal layer, and is provided under the second metal layer.

7. The display apparatus of claim 6, wherein the second metal layer is thicker than the resin layer, and the resin layer is thicker than the first metal layer.

8. The display apparatus of claim 6, wherein the second metal layer is formed on the resin layer to overlap the pad part.

9. The display apparatus of claim 1, wherein the adhesive layer comprises:
a first adhesive layer covering the light emitting device; and
a second adhesive layer provided on the first adhesive layer.

10. The display apparatus of claim 9, wherein a bottom surface of the heat dissipation substrate is formed to be bigger than or equal to a top surface of the second adhesive layer.

11. The display apparatus of claim 1, wherein the heat dissipation substrate comprises aluminum (Al).

12. The display apparatus of claim 1, further comprising
a first adhesive member disposed between the printed circuit board and the heat dissipation substrate, and
a first circuit cover covering the circuit film and the printed circuit board.

13. The display apparatus of claim 12, further comprising a second adhesive member disposed between the printed circuit board and the first circuit cover.

14. The display apparatus of claim 12, wherein one end of the first circuit cover is attached to a bottom surface of the substrate, and another side of the first circuit cover is attached to a top surface of the heat dissipation substrate.

15. The display apparatus of claim 12, further comprising:
a coupling portion provided at an end of the first circuit cover; and
a fixing pin provided in a top surface of the heat dissipation substrate,
wherein the first circuit cover is fixed to the top surface of the heat dissipation substrate by coupling of the coupling portion and the fixing pin.

16. The display apparatus of claim 15, wherein
a side surface of the coupling portion protrudes, and
a groove is provided in an upper portion of the fixing pin.

17. The display apparatus of claim 1, further comprising:
a control printed circuit board provided on a top surface of the heat dissipation substrate;
a plurality of control circuit films electrically connecting the control printed circuit board to the printed circuit board; and
a second circuit cover covering the control printed circuit board and the plurality of control circuit films.

18. The display apparatus of claim 1, further comprising:
a first circuit cover covering the pad part, the circuit film, and the printed circuit board, and
wherein the substrate comprises a top surface, including the pad part, and a light output surface opposite the top surface, and
the first circuit cover covers an edge of the light output surface of the substrate overlapping the pad part.

19. A display apparatus comprising:
a substrate including a display area and a non-display area surrounding the display area;
a light emitting device in the display area, the light emitting device configured to emit light in the display area;
an adhesive layer covering the light emitting device, at least a portion of the adhesive layer in the display area;
a first metal layer provided on the adhesive layer, at least a portion of the first metal layer in the display area;
a resin layer provided on the first metal layer;
a protection substrate provided on the resin layer, directly attached to the first metal layer by the resin layer, each having parallel surfaces, wherein at least a portion of the protection substrate is in the display area;
a pad part provided in the non-display area of the substrate;
a circuit film electrically connected to the pad part; and
a printed circuit board disposed on the protection substrate and electrically connected to the circuit film, wherein the first metal layer is thinner than the resin layer, and the protection substrate is thicker than the first metal layer in the display area.

20. The display apparatus of claim 19, further comprising:
a circuit cover covering the pad part, the circuit film, and the printed circuit board,
wherein the substrate comprises a top surface including the pad part, a light output surface opposite the top surface, and a side surface between the top surface and the light output surface of the substrate, and
wherein the circuit cover is extended to cover the side surface of the substrate.

21. The display apparatus of claim 19, wherein the protection substrate is disposed in an outermost portion of the display apparatus.

* * * * *